US010454471B2

(12) United States Patent
Nomizo et al.

(10) Patent No.: US 10,454,471 B2
(45) Date of Patent: Oct. 22, 2019

(54) POWER SUPPLY SWITCHING CIRCUIT AND ELECTRONIC DEVICE

(71) Applicant: SEIKO EPSON CORPORATION, Tokyo (JP)

(72) Inventors: Hiroaki Nomizo, Ina (JP); Hiroshi Kiya, Suwa (JP); Nobuyuki Oikawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 416 days.

(21) Appl. No.: 15/450,728

(22) Filed: Mar. 6, 2017

(65) Prior Publication Data

US 2017/0279447 A1 Sep. 28, 2017

(30) Foreign Application Priority Data

Mar. 22, 2016 (JP) .................................. 2016-056503

(51) Int. Cl.
*H03K 17/687* (2006.01)

(52) U.S. Cl.
CPC . *H03K 17/6871* (2013.01); *H03K 2217/0018* (2013.01); *H03K 2217/0081* (2013.01)

(58) Field of Classification Search
None
See application file for complete search history.

(56) References Cited

U.S. PATENT DOCUMENTS

| 5,966,043 A * | 10/1999 | Jinbo | G11C 16/30 327/530 |
| 6,040,734 A * | 3/2000 | Villa | G11C 5/143 327/423 |
| 2012/0229172 A1* | 9/2012 | Miyanoiri | H02J 1/10 327/108 |
| 2015/0054550 A1* | 2/2015 | Koyama | H03F 1/0261 327/109 |

FOREIGN PATENT DOCUMENTS

| JP | H06-290593 A | 10/1994 |
| JP | 2012-191705 A | 10/2012 |

* cited by examiner

*Primary Examiner* — Jared Fureman
*Assistant Examiner* — Joel Barnett
(74) *Attorney, Agent, or Firm* — Oliff PLC

(57) ABSTRACT

A power supply switching circuit that selects one power supply potential from among a plurality of power supply potentials. This power supply switching circuit is provided with a transistor QP1 that is connected between an input node N1 and node N2 and has a back gate connected to node N1, a transistor QP2 that is connected between node N2 and output node N3 and has a back gate connected to node N3, a transistor QP3 that is connected between input node N4 and node N5 and has a back gate connected to node N4, a transistor QP4 that is connected between the node N5 and N3 and has a back gate connected to node N3, and a control signal generation unit that sets a group of transistors QP1 and QP2 and a group of transistors QP3 and QP4 to a conduction state and sets the other to a non-conduction state.

8 Claims, 3 Drawing Sheets

POWER SUPPLY SWITCHING CIRCUIT AND ELECTRONIC DEVICE

BACKGROUND

1. Technical Field

The present invention relates to a power supply switching circuit that selects and outputs one power supply potential from among a plurality of power supply potentials. Furthermore, the invention relates to an electronic device or the like that uses such a power supply switching circuit.

2. Related Art

In electronic devices capable of receiving supply of power from a plurality of power supplies, a power supply switching circuit that selects and outputs one power supply potential from among a plurality of power supply potentials is used. In such a power supply switching circuit, there is a problem in that, when selecting one power supply potential from among the plurality of power supply potentials, a short-circuit current flows between input terminals of the plurality of power supply potentials.

As a related technology, in FIG. 1 of JP-A-2012-191705, a power supply switching circuit that selects one of an input power supply voltage V1 and an input power supply voltage V2 in accordance with the detection result of a detector 11 and outputs the selected input power supply voltage as an output power supply voltage V3 is disclosed. A control circuit 41 receives supply of a voltage V4 that is output by a diode OR circuit 42, and supplies the input power supply voltage V2 to a gate of a PMOS transistor 17, supplies the output power supply voltage V3 to a gate of a PMOS transistor 18, and supplies a ground voltage to a gate of a PMOS transistor 19. In that case, the PMOS transistors 17 and 18 turn off, the PMOS transistor 19 turns on, and the input power supply voltage V1 is output from an output terminal T3.

JP-A-2012-191705 (abstract; FIG. 1) is an example of related art.

In the power supply switching circuit of JP-A-2012-191705, cases are conceivable where it is desirable to select the input power supply voltage V2, even when the input power supply voltage V1 is higher than the input power supply voltage V2. However, as shown in FIG. 1 of JP-A-2012-191705, parasitic diodes exist in the PMOS transistors 17 to 19. Accordingly, when the input power supply voltage V2 is selected in the case where the input power supply voltage V1 is higher than the input power supply voltage V2, a short-circuit current will flow from an input terminal T1 of the input power supply voltage V1 to an input terminal T2 of the input power supply voltage V2 via the parasitic diode of the PMOS transistor 19 and the PMOS transistors 17 and 18.

As a result, there is a risk that breakdown of the PMOS transistors 17 to 19 will occur due to the short-circuit current. Also, in the case where a battery is connected to the input terminal T1 or T2, there is a risk that breakdown of the battery will occur due to over-current, or that, in the case where a power supply circuit is connected to the input terminal T1 or T2, the output voltage of the power supply circuit will rise or fall.

SUMMARY

In view of the above, one advantage of some aspects of the invention is to provide a power supply switching circuit that, even when selecting one power supply potential from among a plurality of power supply potentials, does not allow a short-circuit current to flow irrespective of the magnitude relation of the power supply potentials. Another advantage of some aspects of the invention is to enable one power supply potential to be selected in such a power supply switching circuit, according to the magnitudes of the power supply potentials that are supplied. A further advantage of some aspects of the invention is to provide an electronic device or the like that uses such a power supply switching circuit.

According to a first aspect of the invention, a power supply switching circuit includes a first P-channel MOS transistor that has a source and a drain respectively connected to a first node to which a first power supply potential is supplied and a second node, and a back gate connected to the first node, a second P-channel MOS transistor that has a source and a drain respectively connected to the second node and a third node, and a back gate connected to the third node, a third P-channel MOS transistor that has a source and a drain respectively connected to a fourth node to which a second power supply potential is supplied and a fifth node, and a back gate connected to the fourth node, a fourth P-channel MOS transistor that has a source and a drain respectively connected to the fifth node and the third node, and a back gate connected to the third node, and a control signal generation unit that sets one of a group of the first and second P-channel MOS transistors and a group of the third and fourth P-channel MOS transistors to a conduction state and sets the other of the group of the first and second P-channel MOS transistors and the group of the third and fourth P-channel MOS transistors to a non-conduction state, by respectively applying first to fourth control signals having potentials that are greater than or equal to a reference potential and less than or equal to a potential of the respective back gates to the gates of the first to fourth P-channel MOS transistors.

According to the first aspect of the invention, the back gate of the transistor connected to the first or fourth node, which are input nodes, is electrically isolated from the back gate of the transistor connected to the third node, which is an output node. Accordingly, even when the second power supply potential is selected in the case where the first power supply potential is higher than the second power supply potential, inflow of current from the first node to the third node can be prevented. Conversely, even when the first power supply potential is selected in the case where the second power supply potential is higher than the first power supply potential, inflow of current from the fourth node to the third node can be prevented. As a result, a power supply switching circuit can be provided that, even when selecting one power supply potential from among a plurality of power supply potentials, does not allow a short-circuit current to flow irrespective of the magnitude relation of the power supply potentials.

A power supply switching circuit according to a second aspect of the invention further includes, in addition to the above elements, a comparison unit configured to generate a power supply selection signal, by comparing a comparison voltage obtained by dividing a voltage that is a difference between the first power supply potential and the reference potential with a reference voltage, and the control signal generation unit generates the first to fourth control signals in accordance with the power supply selection signal. One power supply potential can thereby be selected, according to the magnitudes of the power supply potentials that are supplied. For example, in a case such as where the first power supply potential is no longer supplied to the first node, the power supply switching circuit is able to select the second power supply potential that is supplied to the fourth node and output the second power supply potential from the third node.

In the second aspect of the invention, a configuration may be adopted in which the control signal generation unit includes a first diode that has an anode connected to the first node and a cathode connected to a sixth node, and a second diode that has an anode connected to the fourth node and a cathode connected to the sixth node, and a potential of the sixth node is supplied to the comparison unit as a power supply potential. The power supply potentials of the control signal generation unit and the comparison unit can thereby be generated, based on the power supply potential of the higher of the first power supply potential that is supplied to the first node and the second power supply potential that is supplied to the fourth node.

Also, a configuration may be adopted in which the control signal generation unit further includes a first level shifter configured to generate the first control signal by shifting a high level of a low active power supply selection signal from the potential of the sixth node to the first power supply potential, a second level shifter configured to generate the second control signal by shifting a high level of the low active power supply selection signal from the potential of the sixth node to a potential of the third node, a third level shifter configured to generate the third control signal by shifting a high level of a high active power supply selection signal from the potential of the sixth node to the second power supply potential, and a fourth level shifter configured to generate the fourth control signal by shifting a high level of the high active power supply selection signal from the potential of the sixth node to the potential of the third node. First to fourth control signals having potentials of a sufficiently high level in order to set the first to fourth P-channel MOS transistors to a non-conduction state can thereby be generated.

Furthermore, a configuration may be adopted in which the comparison unit includes a switch circuit configured to stop a comparison operation in accordance with a setting and fix a level of the power supply selection signal. Consumption current in the comparison unit can thereby be reduced, when a power supply potential does not need to be selected.

An electronic device according to a third aspect of the invention is provided with the power supply switching circuit according to the second aspect of the invention, and a logic circuit configured to stop operation in accordance with a power supply selection signal that is generated when the comparison voltage is lower than the reference voltage. In the case where the electronic device operates using a second power supply potential that is supplied to the fourth node from a battery, for example, drain on the battery can thereby be suppressed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
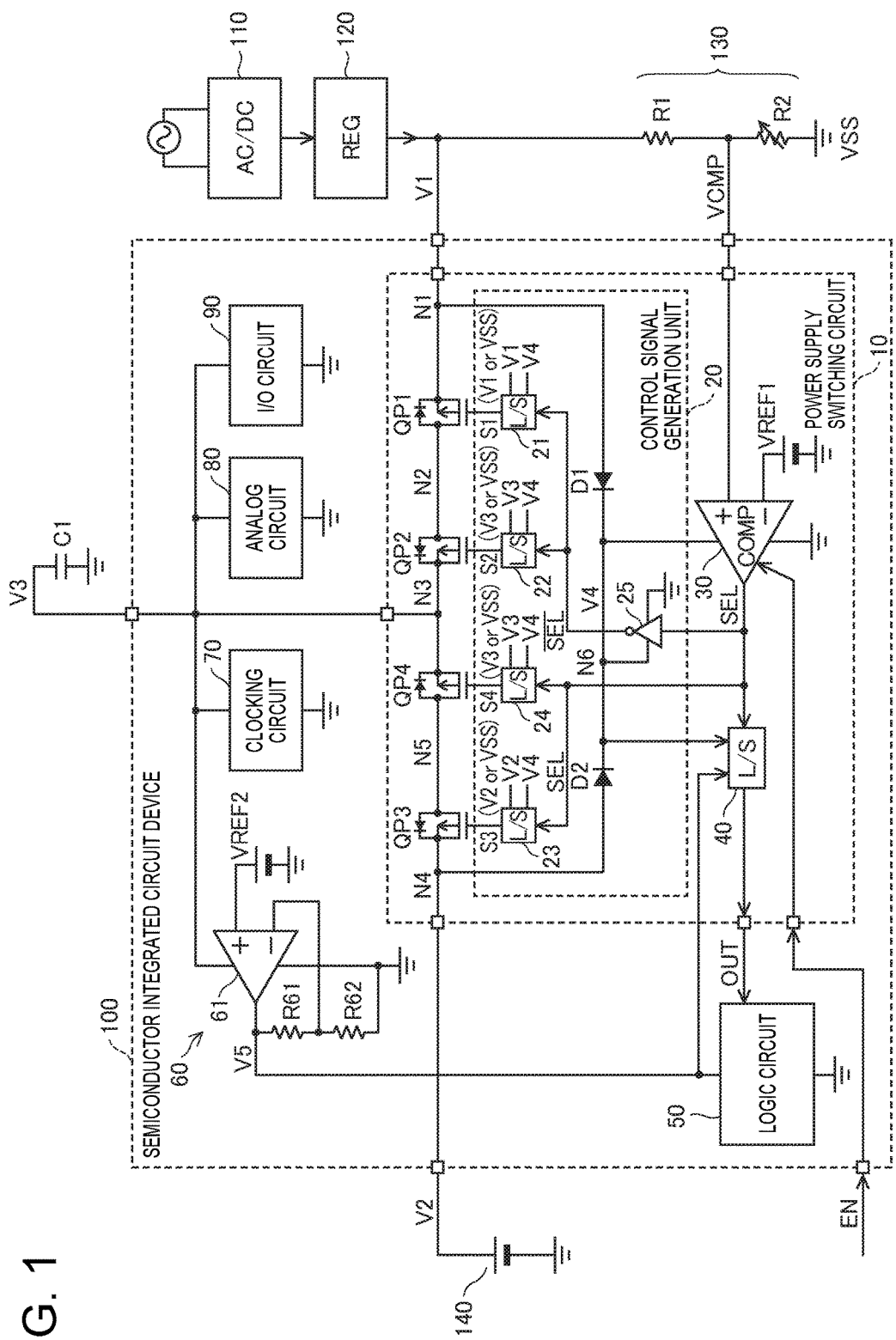
FIG. 1 is a diagram showing an exemplary configuration of an electronic device according to one embodiment of the invention.

Hereinafter, embodiments of the invention will be described in detail with reference to the drawings. Note that like reference signs are given to like elements, and redundant description will be omitted. Hereinafter, the case where the electronic device is a measuring device that measures one or a plurality of parameters such as voltage, current and power will be described as an example.
Electronic Device FIG. 1 is a diagram showing an exemplary configuration of an electronic device according to one embodiment of the invention. As shown in FIG. 1, this electronic device may include a power supply switching circuit 10 according to one embodiment of the invention, a logic circuit 50, a regulator 60, a clocking circuit 70, an analog circuit 80, and an I/O circuit (input/output circuit) 90. Hereinafter, the case where the elements from the power supply switching circuit 10 to the I/O circuit 90 are built into a semiconductor integrated circuit device (IC) 100 will be described. Furthermore, the electronic device may also include an AC/DC converter 110, a regulator (REG) 120, a voltage divider circuit 130, a battery 140 and a capacitor C1.

The AC/DC converter 110 converts an AC power supply voltage that is supplied from an AC power supply such as a pole transformer into a DC power supply voltage. The regulator 120 generates a first power supply potential V1 (e.g., 5V) with reference to a reference potential VSS (e.g., 0V), by stabilizing the DC power supply voltage that is output from the AC/DC converter 110, and supplies the first power supply potential V1 to the power supply switching circuit 10.

The voltage divider circuit 130 includes a resistor R1 and a variable resistor R2 connected in series, and is configured to divide the voltage that is a difference between the first power supply potential V1 and the reference potential VSS and generate a comparison voltage VCMP. The battery 140 supplies a second power supply potential V2 (e.g., 3.6V) to the power supply switching circuit 10 with reference to the reference potential VSS. The capacitor C1 stabilizes an output power supply potential V3 that is output from the power supply switching circuit 10.
Power Supply Switching Circuit The power supply switching circuit 10 selects one of the first power supply potential V1 that is supplied as a main power supply potential to a node N1 and the second power supply potential V2 that is supplied as a sub power supply potential to a node N4, and outputs the selected power supply potential from a node N3. The power supply switching circuit 10 includes P-channel MOS transistors QP1 to QP4 and a control signal generation unit 20, and may further include a comparison unit 30 and a level shifter (L/S) 40.

The transistor QP1 has a source and a drain respectively connected to the node N1 to which the first power supply potential V1 is supplied and a node N2, and a back gate connected to the node N1. A parasitic diode that has an anode connected to the node N2 and a cathode connected to the node N1 exists in the transistor QP1.

The transistor QP2 has a source and a drain respectively connected to the node N2 and the node N3, and a back gate connected to the node N3. A parasitic diode having an anode connected to the node N2 and a cathode connected to the node N3 exists in the transistor QP2.

The transistor QP3 has a source and a drain respectively connected to the node N4 to which the second power supply potential V2 is supplied and a node N5, and a back gate connected to the node N4. A parasitic diode having an anode connected to the node N5 and a cathode connected to the node N4 exists in the transistor QP3.

The transistor QP4 has a source and a drain respectively connected to the node N5 and the node N3, and a back gate connected to the node N3. A parasitic diode having an anode connected to the node N5 and a cathode connected to the node N3 exists in the transistor QP4.

The control signal generation unit 20 respectively applies control signals S1 to S4 that have potentials greater than or equal to the reference potential VSS and less than or equal to the potential of the respective back gates to gates of the transistors QP1 to QP4. The control signal generation unit 20 thereby sets one of a group of the transistors QP1 and QP2 and a group of the transistors QP3 and QP4 to a conduction state (ON state), and sets the other thereof to a non-conduction state (OFF state).

When the transistors QP1 and QP2 are in an ON state and the transistors QP3 and QP4 are in an OFF state, the first power supply potential V1 is selected and supplied to the node N3 as the output power supply potential V3. On the other hand, when the transistors QP3 and QP4 are in an ON state and the transistors QP1 and QP2 are in an OFF state, the second power supply potential V2 is selected and supplied to the node N3 as the output power supply potential V3.

The control signal generation unit 20 includes level shifters (L/S) 21 to 24, an inverter 25, and diodes D1 and D2. The diode D1 has an anode connected to the node N1 to which the first power supply potential V1 is supplied and a cathode connected to a node N6. The diode D2 has an anode connected to the node N4 to which the second power supply potential V2 is supplied and a cathode connected to the node N6.

Accordingly, a potential that has dropped from the higher of the first power supply potential V1 and the second power supply potential V2 by the forward voltage of the diodes is generated in the node N6, which is a junction of the diode D1 and the diode D2. The potential of the node N6 is supplied to the level shifters 21 to 24, the inverter 25, the comparison unit 30 and the like as the internal power supply potential V4. The power supply potential of the control signal generation unit 20, the comparison unit 30 and the like can thereby be generated, based on the power supply potential of the higher of the first power supply potential V1 that is supplied to the node N1 and the second power supply potential V2 that is supplied to the node N4.

The comparison unit 30 is constituted by a comparator and the like, and generates a power supply selection signal SEL, by comparing the comparison voltage VCMP obtained by dividing the voltage that is a difference between the first power supply potential V1 and the reference potential VSS with a reference voltage VREF1. The control signal generation unit 20 generates the control signals S1 to S4, in accordance with the power supply selection signal SEL. In a case such as where the first power supply potential V1 is no longer supplied to the node N1 from the regulator 120, for example, the power supply switching circuit 10 is thereby able to select the second power supply potential V2 that is supplied to the node N4 from the battery 140, and output the second power supply potential V2 from the node N3.

For example, the comparison unit 30 generates a high active power supply selection signal SEL. The high active power supply selection signal SEL will be at a high level (internal power supply potential V4) when the comparison voltage VCMP is higher than the reference voltage VREF1, and at a low level (reference potential VSS) when the comparison voltage VCMP is lower than the reference voltage VREF1. In that case, the inverter 25 of the control signal generation unit 20 inverts the high active power supply selection signal SEL and generates a low active power supply selection signal SEL bar. Note that the control signal generation unit 20 may generate the control signals S1 to S4 in accordance with a power supply selection signal SEL that is supplied from outside the power supply switching circuit 10, instead of the power supply selection signal SEL that is generated by the comparison unit 30.

The level shifter 21 receives supply of the internal power supply potential V4 and the first power supply potential V1, and generates the control signal S1 by shifting the high level of the low active power supply selection signal SEL bar from the internal power supply potential V4 to the first power supply potential V1. The level shifter 22 receives supply of the internal power supply potential V4 and the output power supply potential V3, and generates the control signal S2 by shifting the high level of the low active power supply selection signal SEL bar from the internal power supply potential V4 to the output power supply potential V3. The level shifter 23 receives supply of the internal power supply potential V4 and the second power supply potential V2, and generates the control signal S3 by shifting the high level of the high active power supply selection signal SEL from the internal power supply potential V4 to the second power supply potential V2. The level shifter 24 receives supply of the internal power supply potential V4 and the output power supply potential V3, and generates the control signal S4 by shifting the high level of the high active power supply selection signal SEL from the internal power supply potential V4 to the output power supply potential V3. Control signals S1 to S4 having potentials of a sufficiently high level in order to set the transistors QP1 to QP4 to an OFF state can thereby be generated.

Figure 2:
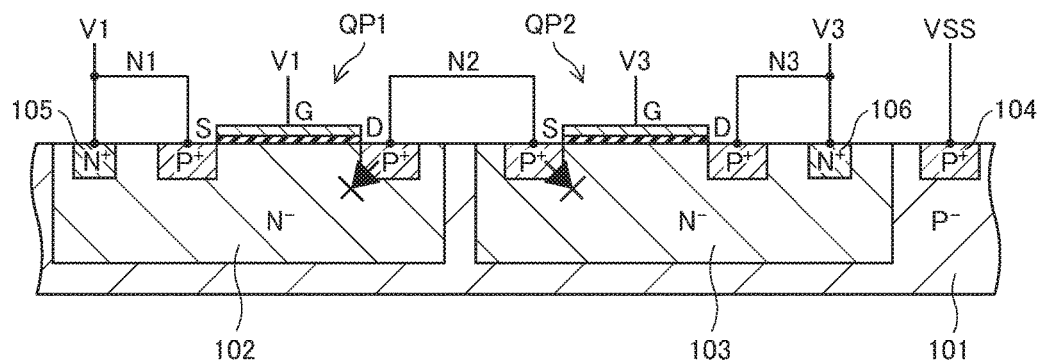
FIG. 2 is a cross-sectional view showing part of a semiconductor integrated circuit device shown in FIG. 1.

FIG. 2 is a cross-sectional view showing part of the semiconductor integrated circuit device shown in FIG. 1. FIG. 2 shows, as an example, the region in which the transistors QP1 and QP2 are provided. As shown in FIG. 2, N-wells 102 and 103 are formed within a P-type semiconductor substrate 101. Also, in order to apply the reference potential VSS to the semiconductor substrate 101, a P-type impurity region 104 is formed within the semiconductor substrate 101.

The transistor QP1 is provided in the N-well 102 electrically connected to the node N1 to which the first power supply potential V1 is supplied. That is, P-type impurity regions that serve as a source S and a drain D of the transistor QP1 are formed within the N-well 102, and a gate electrode G of the transistor QP1 is provided on the N-well 102 via a gate insulation film.

The N-well 102 corresponds to a back gate of the transistor QP1, and in order to apply a potential to the N-well 102, an N-type impurity region 105 is formed within the N-well 102. The source and the back gate of the transistor QP1 are connected to the node N1 and receive supply of the first power supply potential V1. The drain of the transistor QP1 is connected to the node N2.

Also, the transistor QP2 is provided in the N-well 103 electrically connected to the node N3. That is, P-type impurity regions that serve as a source S and a drain D of the transistor QP2 are formed within the N-well 103, and a gate electrode G of the transistor QP2 is provided on the N-well 103 via a gate insulation film.

The N-well 103 corresponds to a back gate of the transistor QP2, and in order to apply a potential to the N-well 103, an N-type impurity region 106 is formed in the N-well 103. The source of the transistor QP2 is connected to the node N2. The drain and the back gate of the transistor QP2 are connected to the node N3.

In the case of selecting the first power supply potential V1 that is supplied to the node N1, the reference potential VSS is applied to the gate of the transistor QP1 and the gate of the transistor QP2. The transistors QP1 and QP2 thereby enter an ON state and the first power supply potential V1 is supplied to the node N3.

On the other hand, in the case of not selecting the first power supply potential V1 that is supplied to the node N1, the first power supply potential V1 is applied to the gate of the transistor QP1, and the output power supply potential V3 is applied to the gate of the transistor QP2, as shown in FIG. 2. The transistors QP1 and QP2 thereby enter an OFF state.

Also, as shown in FIG. 2, a parasitic diode in which the drain D is the anode and the N-well 102 is the cathode exists in the transistor QP1. Similarly, a parasitic diode in which the source S is the anode and the N-well 103 is the cathode exists in the transistor QP2.

Accordingly, when the source S of the transistor QP2 is connected to the node N1 without providing the transistor QP1, current will flow from the node N1 to the node N3 via the parasitic diode of the transistor QP2 in the case where the potential of the node N1 is higher than the potential of the node N3 by greater than or equal to the forward voltage of the diode, even when the transistor QP2 is set to an OFF state.

On the other hand, according to the structure shown in FIG. 2, the back gate (N-well 102) of the transistor QP1 connected to the node N1, which is the input node, is electrically isolated from the back gate (N-well 103) of the transistor QP2 connected to the node N3, which is the output node. Accordingly, even when the second power supply potential V2 is selected in the case where the first power supply potential V1 is higher than the second power supply potential V2, inflow of current from the node N1 to the node N3 can be prevented.

The transistors QP3 and QP4 shown in FIG. 1 also have a similar structure to the transistors QP1 and QP2. Accordingly, even when the first power supply potential V1 is selected in the case where the second power supply potential V2 is higher than the first power supply potential V1, inflow of current from the node N4 to the node N3 can be prevented. As a result, a power supply switching circuit 10 can be provided that, even when selecting one power supply potential from among a plurality of power supply potentials, does not allow a short-circuit current to flow irrespective of the magnitude relation of the power supply potentials.

Exemplary Operations

Figure 3:
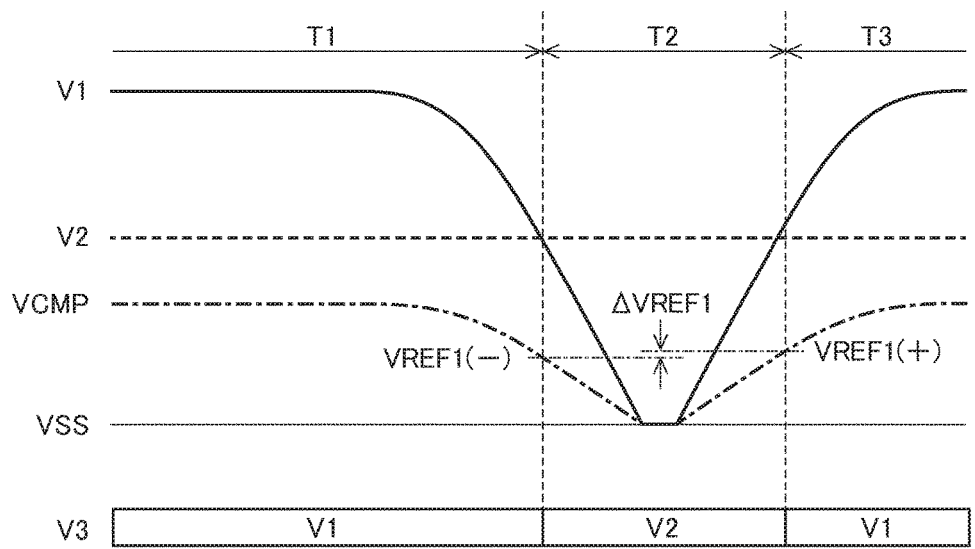
FIG. 3 is a waveform chart showing exemplary operations of a power supply change circuit shown in FIG. 1.

Next, exemplary operations of the power supply switching circuit 10 shown in FIG. 1 will be described, with reference to FIG. 1 and FIG. 3. FIG. 3 is a waveform chart showing exemplary operations of the power supply switching circuit shown in FIG. 1. In this example, the comparison unit 30 is constituted by a Schmitt trigger circuit, and has hysteresis characteristics.

In a first period T1, the first power supply potential V1 that is supplied from the regulator 120 is higher than a predetermined value, and thus the comparison voltage VCMP obtained by dividing the voltage that is a difference between the first power supply potential V1 and the reference potential VSS is higher than a reference voltage VREF1 (−). The comparison unit 30 generates a high level power supply selection signal SEL, by comparing the comparison voltage VCMP with the reference voltage VREF1 (−). Also, the inverter 25 inverts the high level power supply selection signal SEL and generates a low level power supply selection signal SEL bar.

Accordingly, the level shifters 21 and 22 apply the reference potential VSS to the gates of the transistors QP1 and QP2. The transistors QP1 and QP2 thereby enter an ON state. Also, the level shifter 23 applies the second power supply potential V2 to the gate of the transistor QP3, and the level shifter 24 applies the output power supply potential V3 to the gate of the transistor QP4. The transistors QP3 and QP4 thereby enter an OFF state. As a result, in the first period T1, the first power supply potential V1 is selected and supplied to the node N3 as the output power supply potential V3.

Because the comparison voltage VCMP is lower than the reference voltage VREF1 (−) when the first power supply potential V1 that is supplied from the regulator 120 falls below the predetermined value for some reason, the comparison unit 30 changes the power supply selection signal SEL to a low level. Also, the inverter 25 inverts the low level power supply selection signal SEL and generates a high level power supply selection signal SEL bar.

Accordingly, the level shifters 23 and 24 apply the reference potential VSS to the gates of the transistors QP3 and QP4. The transistors QP3 and QP4 thereby enter an ON state. Also, the level shifter 21 applies the first power supply potential V1 to the gate of the transistor QP1, and the level shifter 22 applies the output power supply potential V3 to the gate of the transistor QP2. The transistors QP1 and QP2 thereby enter an OFF state. As a result, in the second period T2, the second power supply potential V2 is selected and supplied to the node N3 as the output power supply potential V3.

Because the comparison voltage VCMP is higher than a reference voltage VREF1 (+) when the first power supply potential V1 supplied from the regulator 120 again exceeds the predetermined value and increases further, the comparison unit 30 changes the power supply selection signal SEL to a high level. As a result, in a third period T3, the first power supply potential V1 is selected and supplied to the node N3 as the output power supply potential V3. As shown in FIG. 3, a difference ΔVREF1 occurs between the reference voltage VREF1 (−) and the reference voltage VREF1 (+), due to the hysteresis characteristics of the comparison unit 30.

Peripheral Circuits

Referring again to FIG. 1, the output power supply potential V3 of the power supply switching circuit 10 is supplied to peripheral circuits such as the regulator 60, the clocking circuit 70, the analog circuit 80 and the I/O circuit 90. The regulator 60 includes an operational amplifier 61 and resistors R61 and R62. The resistors R61 and R62 set the gain of the operational amplifier 61, by dividing the output voltage of the operational amplifier 61 and returning the divided voltage to an inverting input terminal of the operational amplifier 61. The operational amplifier 61 generates a logic power supply potential V5 (e.g., 1.8V), by amplifying a reference potential VREF2 with a set gain, and supplies the logic power supply potential V5 to the logic circuit 50.

The logic circuit 50 includes a logic circuit such as a combinational circuit or a sequential circuit, a CPU (central processing unit), or a storage unit such as a register or a memory, for example, and is controlled in accordance with the power supply selection signal SEL that is generated by the comparison unit 30 of the power supply switching circuit 10. Also, in the case where the breakdown voltage of the circuit element that is included in the logic circuit 50 is lower than the internal power supply potential V4 of the power supply switching circuit 10, the level shifter 40 is provided in the power supply switching circuit 10. The level shifter 40 generates a power supply selection signal OUT by shifting the high level of the power supply selection signal SEL that is generated by the comparison unit 30 from the internal power supply potential V4 to the logic power supply potential V5, and supplies the power supply selection signal OUT to the logic circuit 50.

First Application Example

For example, when AC power supply voltage is no longer supplied at the time of the electronic device shown in FIG. 1 being transported, the AC/DC converter 110 and the regulator 120 stop operating, and the first power supply potential V1 falls to the reference potential VSS. Because the comparison voltage VCMP also falls to the reference potential VSS, the power supply selection signal SEL that is generated by the comparison unit 30 will be at a low level, and the power supply switching circuit 10 thereby selects the second power supply potential V2 that is supplied from the battery 140.

Even when the electronic device is operating using power supply from the battery 140, the clocking circuit 70 continues the clocking operation and continues to generate a clocking signal representing the current time. On the other hand, the logic circuit 50 stops operation in accordance with the power supply selection signal OUT that is generated when the comparison voltage VCMP is lower than the reference voltage VREF1. In the case where the electronic device operates using the second power supply potential V2 that is supplied to the node N4 from the battery 140, drain on the battery 140 can thereby be suppressed.

Alternatively, the logic circuit 50 may be configured to store the power supply selection signal OUT in a storage unit when the level of the power supply selection signal OUT that is supplied from the power supply switching circuit 10 changes. State information relating to whether the electronic device was driven with an AC power supply or was driven with a battery can be subsequently read out from the storage unit. Furthermore, the logic circuit 50 may be configured to store the clocking signal that is generated by the clocking circuit 70 in the storage unit together with the power supply selection signal OUT. State information relating to what time the drive state of the electronic device was switched can be subsequently read out from the storage unit.

Second Application Example

There are also cases where the battery 140 is not necessary once the electronic device shown in FIG. 1 is installed. In such a case, the comparison unit 30 may stop the comparison operation and fix the level of the power supply selection signal SEL.

Figure 4:
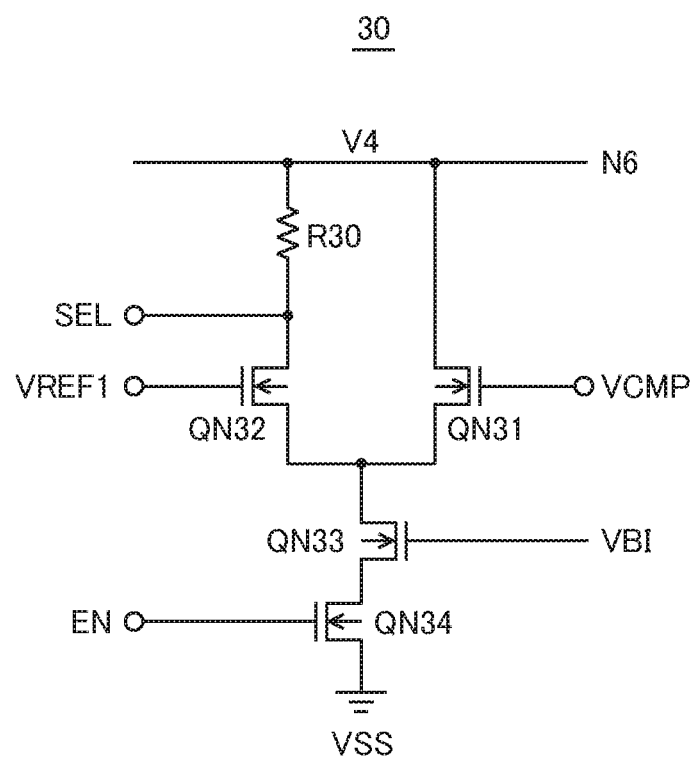
FIG. 4 is a circuit diagram showing an exemplary configuration of a comparison unit shown in FIG. 1.

FIG. 4 is a circuit diagram showing an exemplary configuration of the comparison unit shown in FIG. 1. As shown in FIG. 4, the comparison unit 30 includes a resistor R30 and N-channel MOS transistors QN31 to QN34. Here, the transistors QN31 and QN32 constitute a differential pair. Also, the transistor QN34 constitutes a switch circuit that stops the comparison operation in accordance with the settings and fixes the level of the power supply selection signal SEL.

The transistor QN31 has a drain connected to the node N6 to which the internal power supply potential V4 is supplied, and a gate to which the comparison voltage VCMP is applied. The transistor QN32 has a drain connected to the node N6 via the resistor R30, and a gate to which the reference voltage VREF1 is applied. The power supply selection signal SEL is output from a junction of the resistor R30 and the transistor QN32.

The transistor QN33 has a drain connected to sources of the transistors QN31 and QN32, and a gate to which a bias voltage VBI is applied. The transistor QN34 has a drain connected to a source of the transistor QN33, a gate to which an enable signal EN that is supplied from outside to the terminal of the IC 100 shown in FIG. 1 is applied, and a source connected to wiring of the reference potential VSS. A switch for setting the level of the enable signal EN may be connected to the above terminals of the IC 100.

When the enable signal EN is at a high level, the transistor QN34 enters an ON state and allows current to flow through the transistors QN31 to QN33, and the comparison unit 30 thus performs the comparison operation. On the other hand, when the enable signal EN is at a low level, the transistor QN34 enters an OFF state and current does not flow through the transistors QN31 to QN33, and the comparison unit 30 thus stops the comparison operation and the power supply selection signal SEL is fixed at a high level.

In an initial state, a high level enable signal EN is supplied to the comparison unit 30. The comparison unit 30 generates the power supply selection signal SEL, by comparing the comparison voltage VCMP with the reference voltage VREF1, when the enable signal EN is at a high level. The power supply switching circuit 10 selects one of the first power supply potential V1 that is supplied from the regulator 120 and the second power supply potential V2 that is supplied from the battery 140, in accordance with the power supply selection signal SEL.

Thereafter, a low level enable signal EN is supplied to the comparison unit 30, in accordance with the settings. The comparison unit 30 stops the comparison operation and fixes the power supply selection signal SEL at a high level, when the enable signal EN is at a low level. The power supply switching circuit 10 thereby selects the first power supply potential V1 that is supplied from the regulator 120. Adopting this configuration enables the consumption current in the comparison unit 30 to be reduced, when a power supply potential does not need to be selected. Note that the enable signal EN can also be utilized at the time of testing the electronic device shown in FIG. 1.

In the above embodiment, the electronic device was described as being a measuring device, but apart from a measuring device, the invention can, for example, be applied to an electronic device such as a calculator, an electronic dictionary, an electronic game machine, a mobile phone or similar mobile terminal, a digital still camera, a digital video camera, a television, a TV phone, a security television monitor, a head-mounted display, a personal computer, a printer, a network device, a car navigation device, a measurement device, and a medical device (e.g., electronic thermometer, sphygmomanometer, blood glucose meter, electrocardiograph device, ultrasonic diagnostic apparatus, and electronic endoscope). The invention is thus not limited to the embodiment described above, and many modifications can be made within the technical idea of the invention by a person having ordinary skill in the art.

The entire disclosure of Japanese Patent Application No. 2016-056503, filed Mar. 22, 2016 is expressly incorporated by reference herein.

What is claimed is:

1. A power supply switching circuit comprising:
    a first P-channel MOS transistor that is connected between a first node to which a first power supply potential is supplied and a second node, and has a source, a drain and a back gate which is connected to the first node;
    a second P-channel MOS transistor that is connected between the second node and a third node, and has a source, a drain and a back gate which is connected to the third node;
    a third P-channel MOS transistor that is connected between a fourth node to which a second power supply potential is supplied and a fifth node, and has a source, a drain and a back gate which is connected to the fourth node;
    a fourth P-channel MOS transistor that is connected between the fifth node and the third node, and has a source, a drain and a back gate which is connected to the third node; and
    a control signal generation unit that sets one of a group of the first and second P-channel MOS transistors and a group of the third and fourth P-channel MOS transistors to a conduction state and sets the other of the group of the first and second P-channel MOS transistors and the group of the third and fourth P-channel MOS transistors to a non-conduction state, by respectively applying first to fourth control signals having potentials that are greater than or equal to a reference potential and less than or equal to a potential of the respective back gates to the gates of the first to fourth P-channel MOS transistors.

2. The power supply switching circuit according to claim 1, further comprising:
    a comparison unit configured to generate a power supply selection signal, by comparing a comparison voltage obtained by dividing a voltage that is a difference between the first power supply potential and the reference potential with a reference voltage,
    wherein the control signal generation unit generates the first to fourth control signals in accordance with the power supply selection signal.

3. The power supply switching circuit according to claim 2,
    wherein the control signal generation unit includes:
    a first diode that has an anode connected to the first node and a cathode connected to a sixth node; and
    a second diode that has an anode connected to the fourth node and a cathode connected to the sixth node, and a potential of the sixth node is supplied to the comparison unit as a power supply potential.

4. The power supply switching circuit according to claim 3,
    wherein the control signal generation unit further includes:
    a first level shifter configured to generate the first control signal by shifting a high level of a low active power supply selection signal from the potential of the sixth node to the first power supply potential;
    a second level shifter configured to generate the second control signal by shifting a high level of the low active power supply selection signal from the potential of the sixth node to a potential of the third node;
    a third level shifter configured to generate the third control signal by shifting a high level of a high active power supply selection signal from the potential of the sixth node to the second power supply potential; and
    a fourth level shifter configured to generate the fourth control signal by shifting a high level of the high active power supply selection signal from the potential of the sixth node to the potential of the third node.

5. The power supply switching circuit according to claim 2,
    wherein the comparison unit includes:
    a switch circuit configured to stop a comparison operation in accordance with a setting and fix a level of the power supply selection signal.

6. An electronic device comprising:
    the power supply switching circuit according to claim 2; and
    a logic circuit configured to stop operation in accordance with a power supply selection signal that is generated when the comparison voltage is lower than the reference voltage.

7. An electronic device comprising:
    the power supply switching circuit according to claim 3; and
    a logic circuit configured to stop operation in accordance with the power supply selection signal that is generated when the comparison voltage is lower than the reference voltage.

8. An electronic device comprising:
    the power supply switching circuit according to claim 4; and
    a logic circuit configured to stop operation in accordance with the power supply selection signal that is generated when the comparison voltage is lower than the reference voltage.

* * * * *